United States Patent
Nagel et al.

(10) Patent No.: US 9,431,602 B2
(45) Date of Patent: Aug. 30, 2016

(54) TOP ELECTRODE COUPLING IN A MAGNETORESISTIVE DEVICE USING AN ETCH STOP LAYER

(71) Applicant: Everspin Technologies, Inc., Chandler, AZ (US)

(72) Inventors: Kerry Joseph Nagel, Scottsdale, AZ (US); Sanjeev Aggarwal, Scottsdale, AZ (US); Moazzem Hossain, Chandler, AZ (US); Nicholas Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/297,389

(22) Filed: Jun. 5, 2014

(65) Prior Publication Data

US 2015/0357559 A1    Dec. 10, 2015

(51) Int. Cl.
*H01L 43/12*    (2006.01)
(52) U.S. Cl.
CPC .................................... *H01L 43/12* (2013.01)
(58) Field of Classification Search
None
See application file for complete search history.

(56) References Cited

U.S. PATENT DOCUMENTS

| | | | | |
|---|---|---|---|---|
| 6,806,096 B1* | 10/2004 | Kim | ...................... | H01L 43/12 257/E27.005 |
| 2004/0081841 A1* | 4/2004 | Nakajima | .............. | B82Y 10/00 428/492 |
| 2004/0164320 A1* | 8/2004 | Quek | ................. | H01L 29/6656 257/197 |
| 2005/0199925 A1* | 9/2005 | Kajiyama | .............. | B82Y 10/00 257/295 |
| 2006/0261425 A1* | 11/2006 | Suemitsu | ................ | H01L 43/12 257/421 |
| 2008/0096290 A1* | 4/2008 | Smith | ..................... | H01L 43/12 438/3 |

* cited by examiner

*Primary Examiner* — Duy T Nguyen
*Assistant Examiner* — Bo Bin Jang

(57) ABSTRACT

A layer of silicon nitride above the bottom electrode and on the sidewalls of the magnetoresistive stack serves as an insulator and an etch stop during manufacturing of a magnetoresistive device. Non-selective chemical mechanical polishing removes any silicon nitride overlying a top electrode for the device along with silicon dioxide used for encapsulation. Later etching operations corresponding to formation of a via to reach the top electrode use selective etching chemistries that remove silicon dioxide to access the top electrode, but do not remove silicon nitride. Thus, the silicon nitride acts as an etch stop, and, in the resulting device, provides an insulating layer that prevents unwanted short circuits between the via and the bottom electrode and between the via and the sidewalls of the magnetoresistive device stack.

15 Claims, 8 Drawing Sheets

TOP ELECTRODE COUPLING IN A MAGNETORESISTIVE DEVICE USING AN ETCH STOP LAYER

TECHNICAL FIELD

The disclosure herein relates generally to magnetoresistive devices and more particularly to the manufacture of such devices in a manner that improves robustness in device manufacturing while ensuring proper device operation.

BACKGROUND

Magnetoresistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin, on the order of a few or tens of angstroms. Similarly, the dimensions of such layers after patterning and etching are extremely small, and small deviations or imperfections during processing can have a significant impact on device performance.

Because an MRAM device may include thousands or millions of MTJ elements, precise processing steps used in manufacturing the devices can contribute to increased densities by allowing devices to be placed in close proximity without unwanted interaction. In addition to ensuring precision with respect to processing, the selection and formation of the materials included in the device layers impacts how certain processing steps are performed and can aid in increasing the robustness of the manufacturing process. Therefore, it is desirable to provide techniques for manufacturing such devices that support increased densities, ensure proper device operation, and provide robustness in device manufacturing.

DETAILED DESCRIPTION

Figure 1:
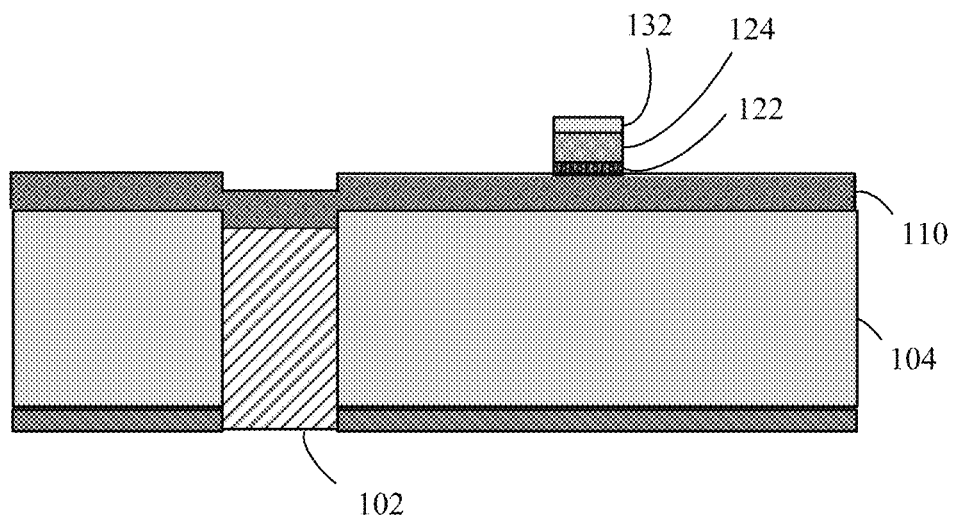
FIGS. 1-9 illustrate cross-sectional views of layers included in a magnetoresistive device during different stages of the manufacturing in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote non-exclusive inclusion. The term "exemplary" is used in the sense of "example," rather than "ideal."

During the course of this description, like numbers may be used to identify like elements according to the different figures that illustrate the various exemplary embodiments.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing a magnetoresistive-based device having one or more electrically conductive electrodes or conductors on either side of a magnetoresistive stack. As described in further detail below, the magnetoresistive stack may include many different layers of material, where some of the layers include magnetic materials, whereas others do not. In some embodiments, the methods of manufacturing include forming the layers for the magnetoresistive device and then masking and etching those layers to produce a magnetic tunnel junction (MTJ) device. Examples of MTJ devices include transducers such as electromagnetic sensors as well as memory cells.

Magnetoresistive devices are typically formed to include a top electrode and a bottom electrode that permit access to the device by allowing for connectivity to other circuit elements. In the example of a magnetic memory (MRAM) cell, one of the electrodes may be coupled to a bit line, whereas the other is coupled to a sense line. A selection transistor may be included between one of the electrodes and the bit or sense line to allow for selection/de-selection of the particular memory cell. The coupling to the electrodes may be accomplished using vias, which are inter-layer holes within insulating material of the device structure that are filled with conductive material, thereby allowing electrical current to pass between the layers joined by the via.

A set of layers is included between the electrodes of the magnetoresistive device, where the set of layers may be referred to as the "magnetoresistive stack." In a magnetoresistive device that includes a magnetic tunnel junction (MTJ), the magnetoresistive stack includes a fixed layer and a free layer on either side of a dielectric layer that forms a tunnel junction. In some embodiments, the fixed layer achieves its fixed magnetization based on interaction with an antiferromagnetic material. In other embodiments, the fixed magnetization may be achieved through other means, including the manner in which the fixed layer was formed, shape anisotropy, etc. In manufacturing such magnetoresistive devices, a set of layers is first deposited on the wafer and then patterned and etched in multiple steps to define the electrodes, the various layers in between, and any underlying and overlying connections and circuits.

A potential problem associated with formation of vias used to connect to the electrodes of the device is unintentional shorting between layers. Because the layers included within the magnetoresistive stack are small in dimension, over-etching during via formation can result in the via shorting the top and bottom electrodes, or shorting the top electrode to a lower magnetic layer within the magnetoresistive stack. As discussed in more detail below, providing a layer of insulating material that isolates the bottom electrode and any lower magnetic layers in the stack can help to ensure that such short circuits do not occur. Such a layer of insulating material can be achieved by using insulating material that is selective with respect to the via etching process such that it is not removed during the etch, thereby acting as an etch stop layer. Deposition of the layer of insulating material can also cover the sidewalls of the stack structure, thereby protecting those portions of the device from unwanted electrical connections. Choosing different etching and polishing chemistries for different aspects of the device processing can allow for both selective and nonselective removal of material during particular processing steps. In example embodiments, silicon dioxide ($SiO_2$) and silicon nitride ($Si_3N_4$) are used to provide separate insulating layers, where the silicon dioxide allows for via formation and the silicon nitride provides an etch stop function that avoids unwanted short circuits.

FIG. 1 illustrates a cross-sectional view of a partially formed magnetoresistive device disposed on a substrate. The cross-sectional view shows a plurality of layers, where each of the layers is formed, deposited, grown, sputtered, or otherwise provided. The layers may be deposited using any technique now known or later developed. The simplified cross-sectional view presented in FIG. 1 includes lower layer of electrically conductive material 110, magnetoresistive stack 122, top electrode 124, and patterned hard mask 132. The cross-sectional view shown in FIG. 1 corresponds to a point in time after which the layers corresponding to the hard mask 132, top electrode 124, and magnetoresistive stack 122 have already been deposited and selectively etched to form those resulting structures overlying the layer of conductive material 110. The electrically conductive layer 110 provides the material used to define the bottom electrode for the magnetoresistive device.

The magnetoresistive stack 122 may include a number of different layers of both magnetic and nonmagnetic material. For example, the layers of the stack may include multiple layers of magnetic material, dielectric layers that provide one or more tunnel barriers or diffusion barriers, coupling layers between layers of magnetic material that provide for ferromagnetic or antiferromagnetic coupling, one or more layers of anti-ferromagnetic material, as well as other layers utilized in magnetoresistive stacks as currently known or later developed. In one example, the magnetoresistive stack may include a lower layer of magnetic material, an upper layer of magnetic material, and a dielectric layer providing a tunnel barrier between the upper and lower layers of magnetic material. The lower layer of magnetic material may include a set of layers forming a synthetic antiferromagnetic structure (SAF), and the upper layer of magnetic material may include a set of layers corresponding to a synthetic ferromagnetic structure (SYF). In another embodiment, the lower layer of magnetic material may include a SAF structure as well as a layer of antiferromagnetic material that provides a reference magnetic field for the SAF structure. Notably, each of the layers included in the magnetoresistive device may be a composite layer that includes multiple sub-layers. In other embodiments, the magnetoresistive stack may include multiple SAFs, SYFs, and tunnel barriers in addition to the other layers, where the materials and structures are arranged in various combinations and permutations now known or later developed.

As shown in FIG. 1, insulating material 104 is disposed under the lower layer of conducting material 110, wherein the insulating material 104 serves to separate different vertical layers within the structure. Within insulating material 104 is a via 102 connected to the lower layer of electrically conductive material 110, thereby providing access to the magnetoresistive device. Not shown in FIG. 1 are the additional connections to the via 102 corresponding to other circuit elements within the structure. For example, the via 102 may connect the lower electrode of the magnetoresistive device to a selection transistor that provides one means of controlling current flow through the magnetoresistive stack 122.

Figure 2:
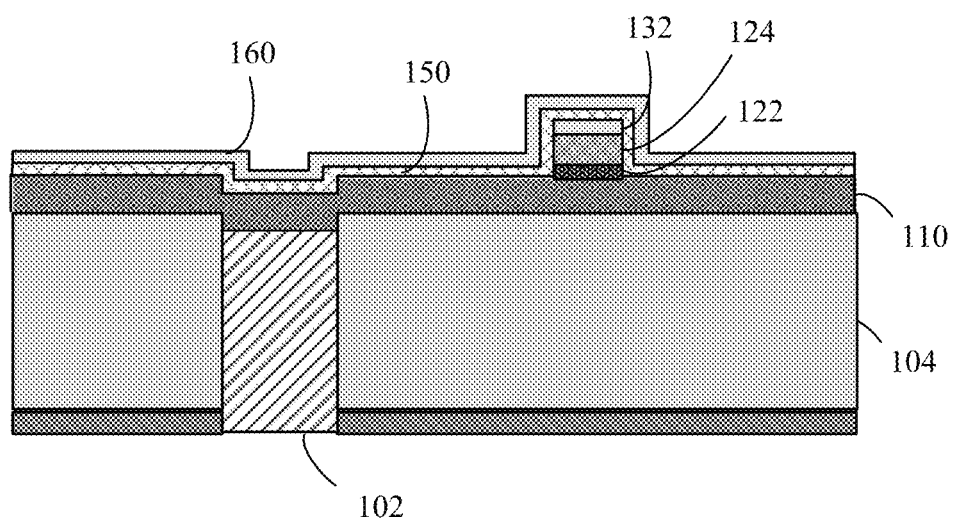

In FIG. 2, the cross-sectional view of FIG. 1 is updated to reflect the deposition of a layer of silicon nitride 150 and a layer of silicon dioxide 160. The layer silicon nitride 150, which may also be referred to as "PEN" as shorthand for plasma enhanced nitride, covers all of the exposed aspects of the structure illustrated in FIG. 1. Thus, the surface of the exposed portions of the lower layer of electrically conductive material 110 is covered, as are the sidewalls of the magnetoresistive stack 122, top electrode 124, and hard mask 132. Similarly, the layer of silicon dioxide 160 overlies the entirety of the layer of silicon nitride 150, such that all of the previously exposed portions of the structure are blanketed with two distinct layers of insulating material. The silicon dioxide layer 160 may be deposited using tetraethyl orthosiliconte ($Si(OC_2H_5)_4$), which is commonly referred to as TEOS.

While FIGS. 1 and 2 show the deposition of the layers of silicon nitride 150 and silicon dioxide 160 after the magnetoresistive stack is fully formed, in other embodiments, those layers may be deposited after partial formation of the magnetoresistive stack. In many embodiments, the etching to form that magnetoresistive stack is separated into multiple steps. In such embodiments, it may be beneficial to deposit the layer of silicon nitride 150 and the layer of silicon dioxide 160 part-way through the stack formation process. For example, it may be beneficial to deposit the layers 150 and 160 after the top portion of the stack has been etched. More specifically, the layers 150 and 160 may be deposited just before or just after the etching that results in formation of the tunnel barrier separating free and fixed layers of the device. As detailed further below, the layer 150 provides an etch-stop and isolation function with respect to later via formation, and isolating magnetic layers or other layers in the lower portion of the magnetoresistive stack may be beneficial for the same or similar reasons as isolating the bottom electrode. While FIGS. 1-9 reflect an embodiment in which layers 150 and 160 are deposited after complete formation of the magnetoresistive stack and prior to etching of the bottom electrode, in other embodiments the layers 150 and 160 are deposited prior to complete formation of the stack, where those layers may be etched in conjunction with layer 110 when the bottom electrode is formed.

Figure 3:
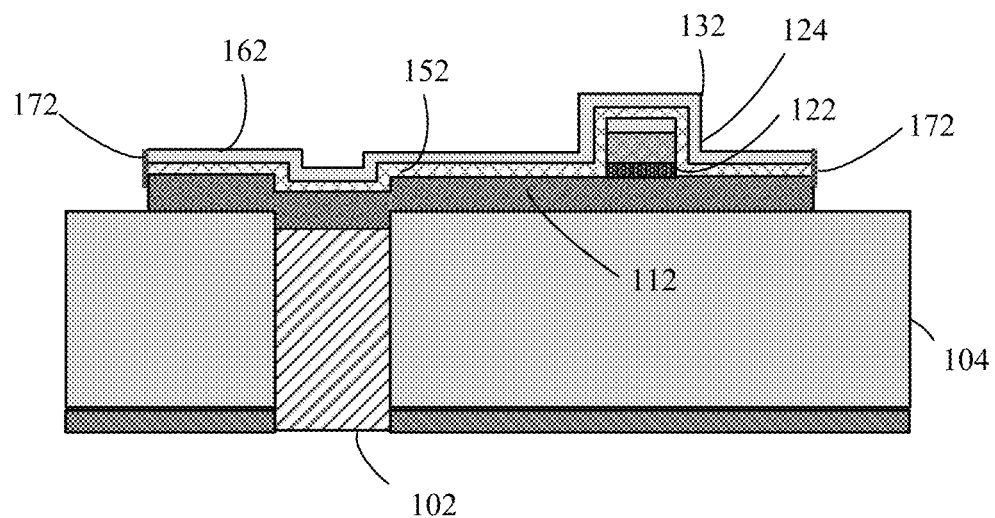

In FIG. 3, the cross-sectional view of FIG. 2 has been updated to illustrate the formation of the lower electrode 112 from the lower layer of electrically conductive material 110. As noted above, forming the lower electrode 112 may also include etching some portion of the layers corresponding to the magnetic stack. In a specific example, forming the lower electrode 112 includes forming a set of layers corresponding to a fixed portion of an MTJ device. The etching used to form the lower electrode 112 also provides separation between the device and any neighboring devices by removing any conductive material between the devices. As is shown, portions of the layer of silicon nitride 150 are removed to produce silicon nitride layer 152, and portions of the layer of silicon dioxide 160 are removed to produce silicon dioxide layer 162. The etching used to form the bottom electrode 112 may also result in veils 172, which are collections of residual material that may be conductive. Such veils 172 provide another potential current path that may lead to shorting of the bottom electrode 112 to the top electrode if the via placement to the top electrode is not closely controlled.

Figure 4:
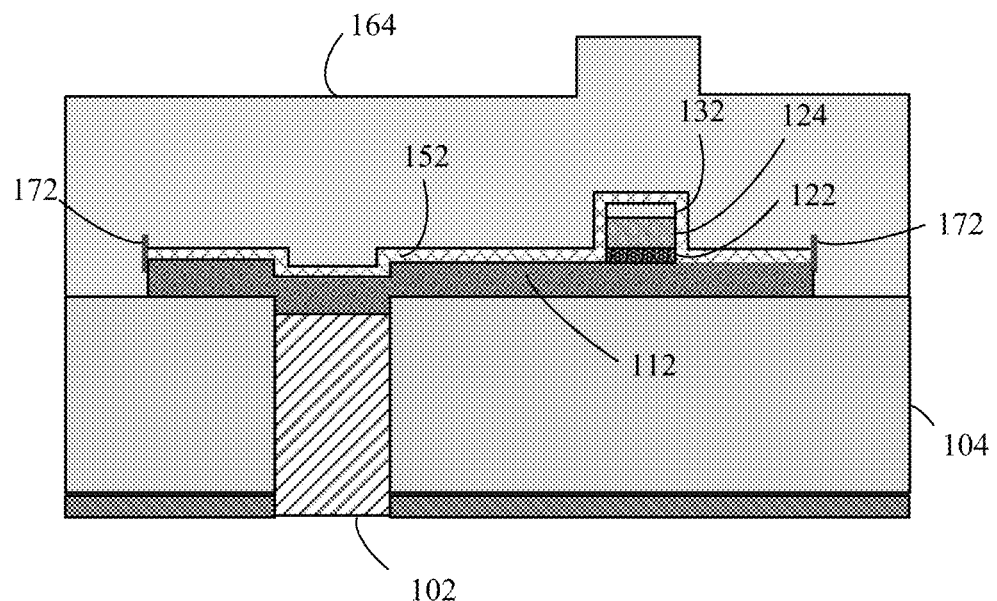

In FIG. 4, additional silicon dioxide 164 is deposited to fill in the gaps between devices left from definition of the bottom electrode 112. In addition, the silicon dioxide 164 covers the device structure in its entirety, thereby encapsulating the device and providing a significant amount of material above all aspects of the device structure formed thus far.

Figure 5:
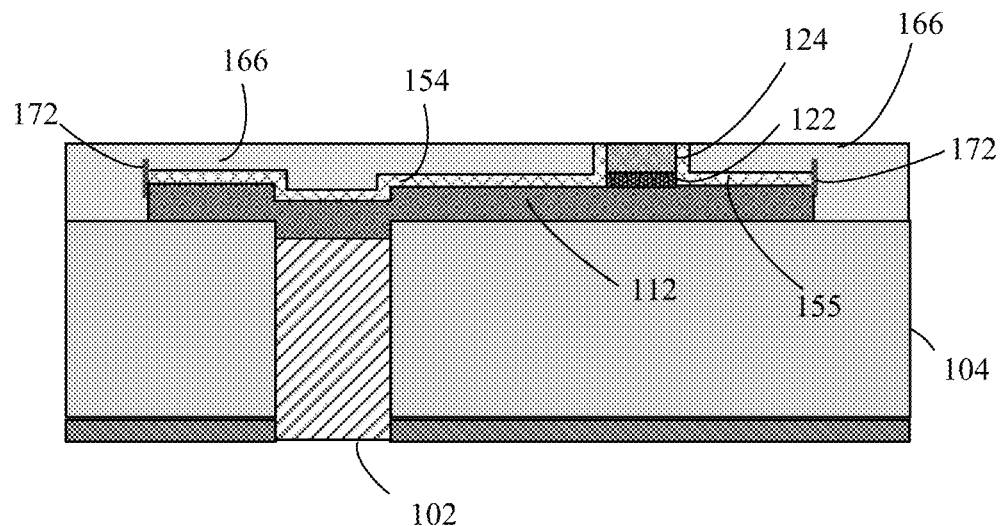

As shown in FIG. 5, after deposition of the additional silicon dioxide shown in FIG. 4, the material above the top electrode 124 is removed. The material removal may be accomplished using a polishing step, such as a chemical mechanical polish. The removal of material above the top electrode 124 is preferably done in a nonselective manner such that the portions of the silicon dioxide 164, silicon nitride 152, and hard mask 132 (which may also be silicon dioxide) are all removed at approximately the same rate. In other words, the chemical mechanical polishing or other removal technique should be equally selective with respect to all of the overlying material. As is shown, the removal of material results in a generally planar surface that is about even with the upper surface of the top electrode 124. Such removal results in the layer of silicon nitride 150 being divided into silicon nitride layers 154 and 155 on either side of the magnetoresistive stack. In some embodiments, the material removal may be non-selective with respect to the top electrode material 124 such that top electrode material may be removed at a similar rate as the portions of the silicon dioxide 164, silicon nitride 152, and hardmask 132. In such embodiments, the generally planar surface shown in FIG. 5 results. In other embodiments, the material removal may be selective with respect to the top electrode material 124 such that top electrode material is not removed at a similar rate as the portions of the silicon dioxide 164, silicon nitride 152, and hardmask 132. In such other embodiments, a protrusion above the final polished layer may result that consists solely of top electrode material. An example of such an embodiment is discussed below in the context of FIG. 9.

In order to stop the material removal at the appropriate time, an endpoint signal corresponding to the material included in the top electrode may be used to determine when the removal should be stopped. For example, optical emission spectroscopy or some other detection technique can be used to determine when the top portion of the top electrode has been reached. More specifically, if the top electrode is formed of tantalum (Ta) or tantalum nitride (TaN), detection of tantalum or tantalum nitride would signal that the top of the electrode has been reached and material removal should stop.

Figure 6:
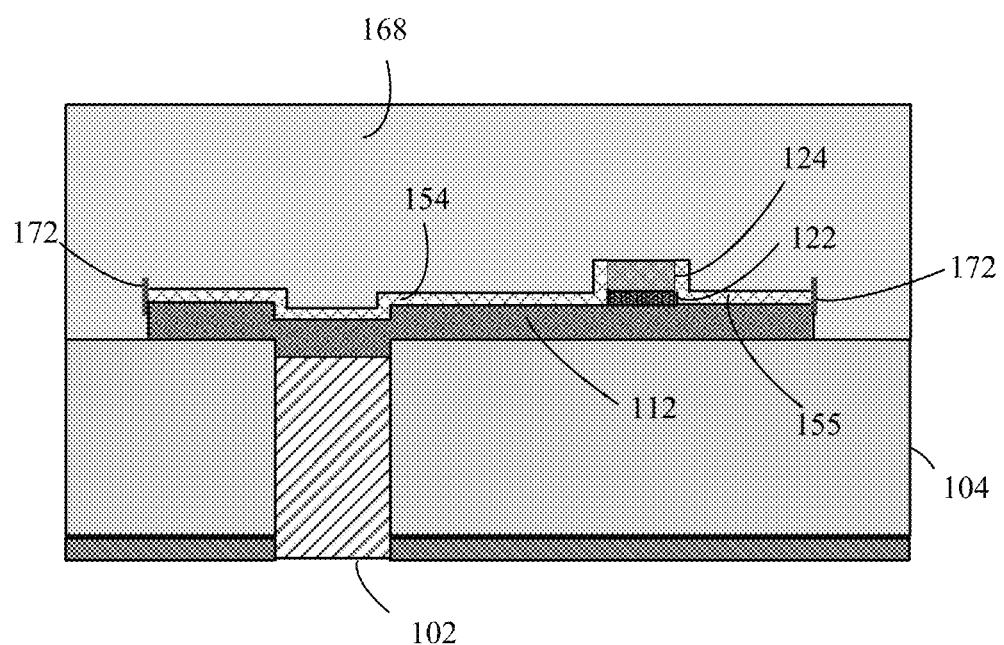
Figure 7:
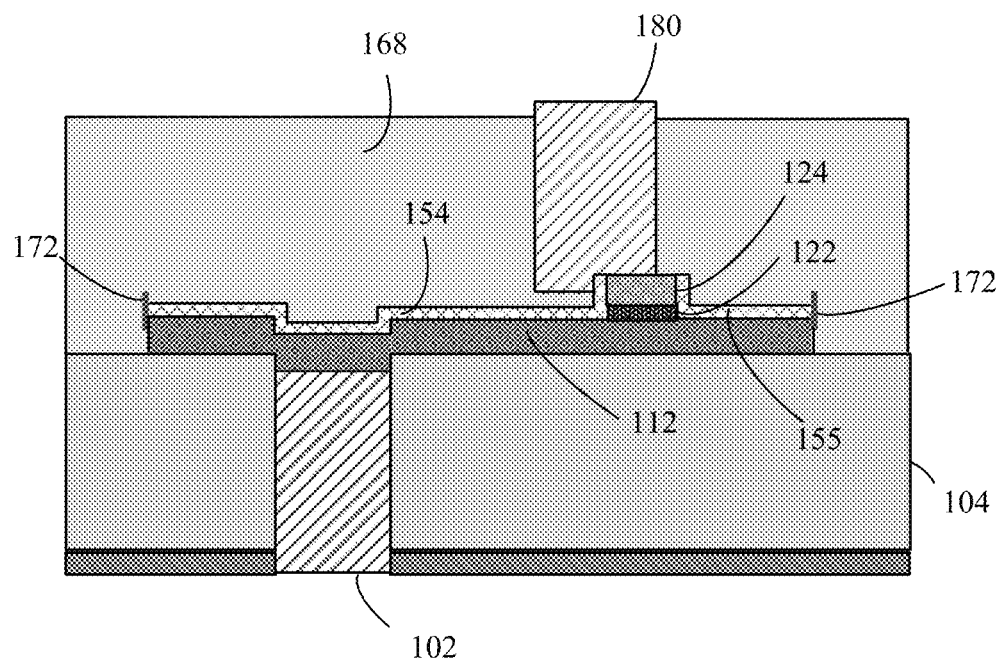

As shown in FIG. 6, following the material removal, more silicon dioxide 168 is redeposited over the structure depicted in FIG. 5, thereby providing inter-layer insulating material within which a connection via can be formed. FIG. 7 shows such a via 180 formed within the silicon dioxide 168. The via 180 can be formed using an etch that is selective with respect to the silicon nitride such that etching removes the silicon dioxide overlying at least some portion the top portion of the top electrode 124, but the etch will not penetrate or remove silicon nitride. Once a hole has been etched, it can be filled with conductive material such as copper. The via 180 is able to electrically couple to the top electrode 124, while the sidewalls of the magnetoresistive stack 122 and the top surface of the bottom electrode 112 (or lower layers of the magnetoresistive stack in embodiments where the layers 150 and 160 are deposited after partial stack formation) are electrically isolated from the via 180 by the insulating silicon nitride 154. By using etching chemistries that are selective with respect to silicon nitride, the layer of silicon nitride 154 acts as an etch stop, or barrier to further etching. Thus, by using two separate layers of insulating material that can be distinguished during etching operations, the etching corresponding to via placement can proceed with less concern for problems associated with over etching or undesirable shorting.

Figure 8:
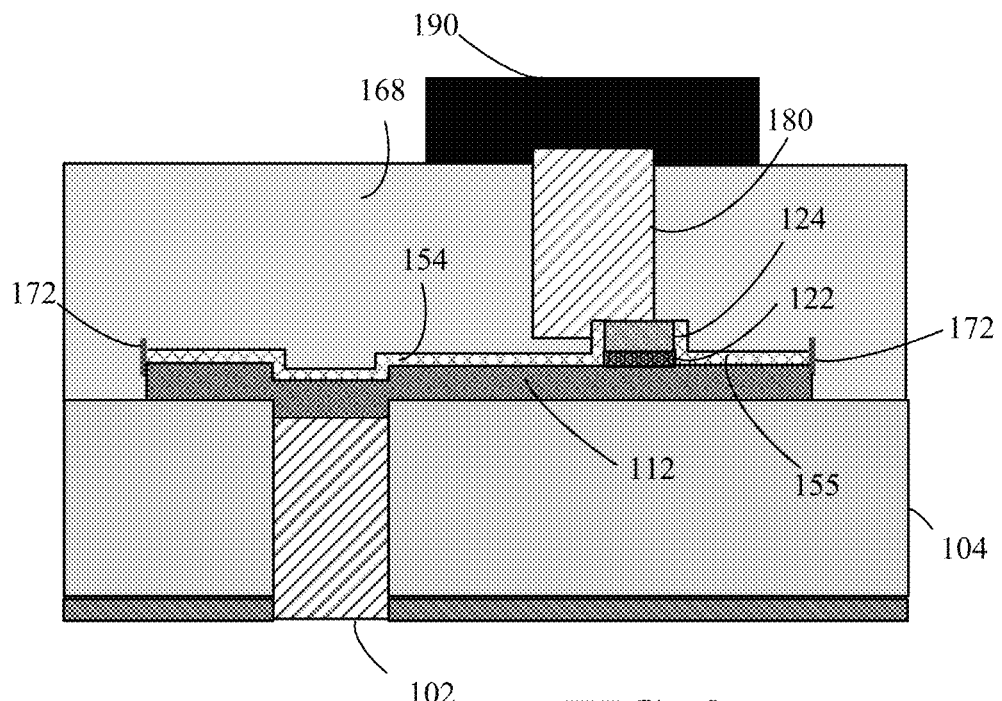

As shown in FIG. 8, a bit line 190 is formed overlying and coupled to the via 180. As depicted, the bit line 190 extends into and out of the page and may provide electrical connections to a large number of magnetoresistive devices, such as in an array of magnetic memory devices. The positioning of the via 180 in FIG. 8 is slightly offset from the center of the magnetoresistive stack 122 and top electrode 124. In the example illustrated, this may be done in order to avoid potential shorting to the veil 172 located to the right of the magnetoresistive stack 122. In other embodiments, different positioning of the via 180 may be used. In general, it is desirable to scale the magnetoresistive stack to be small. In some embodiments, such scaling may make hinder or prevent placement of a via within the patterned magnetoresistive stack geometry as minimum via sizes may be similar to or greater than corresponding size of the magnetoresistive stack. Similarly, the underlying via 102 that couples to the bottom electrode 112 is shown to be offset significantly to the left from the magnetoresistive stack 122. In other embodiments, the via 102 may be located in a different position such as directly under the magnetoresistive stack 122. As one of ordinary skill in the art appreciates, as device geometries continue to shrink, the potential problems associated with over-etching and unintentional shorting increases. As such, the inclusion of the layer of silicon nitride that acts as an etch stop and insulates the relevant portions of the magnetoresistive device from the via 180 can be increasingly beneficial as those geometries shrink. The silicon dioxide re-deposition following the polishing to expose the top electrode 124 also ensures that the possible veil material 172 is a defined distance below the bit line 190, which also helps to prevent undesirable shorting.

Figure 9:
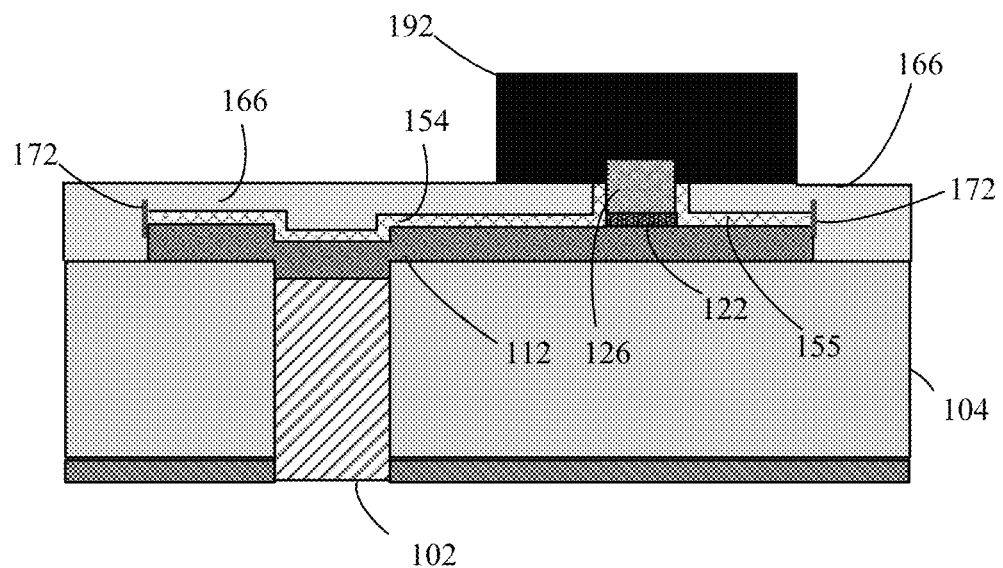

FIG. 9 provides a cross-sectional view of an alternate embodiment in which the top electrode 126 is directly connected to the bit line 192, thereby avoiding the need for the via 180 illustrated in FIG. 8. Such a direct connection may be facilitated by selectively removing the material covering the top electrode in order to expose at least the upper surface of the electrode 126, and possibly a portion of the sidewalls of the top electrode 126. Exposing a portion of the sidewalls can improve the electrical connection between the bit line 192 and the top electrode 126. As shown in FIG. 9, the top electrode 126 may extend slightly above the plane corresponding to the field of silicon dioxide 166 on either side of the magnetoresistive stack 122. Referring back to FIG. 5, the chemical mechanical polishing that is nonselective with respect to silicon dioxide and silicon nitride may be selective with respect to the material included in the top electrode. In such a scenario, rather than removing the portions of the layers of silicon nitride and silicon dioxide to form a generally planar surface, the material removal may continue to remove additional silicon nitride and silicon dioxide below the level corresponding to the upper surface of the top electrode 126, while leaving the top electrode material itself intact. As such, an upper portion of the top electrode 126 may extend above the generally flat surface resulting from removal of the silicon dioxide and silicon nitride. Such an embodiment is shown in FIG. 9.

Figure 10A:
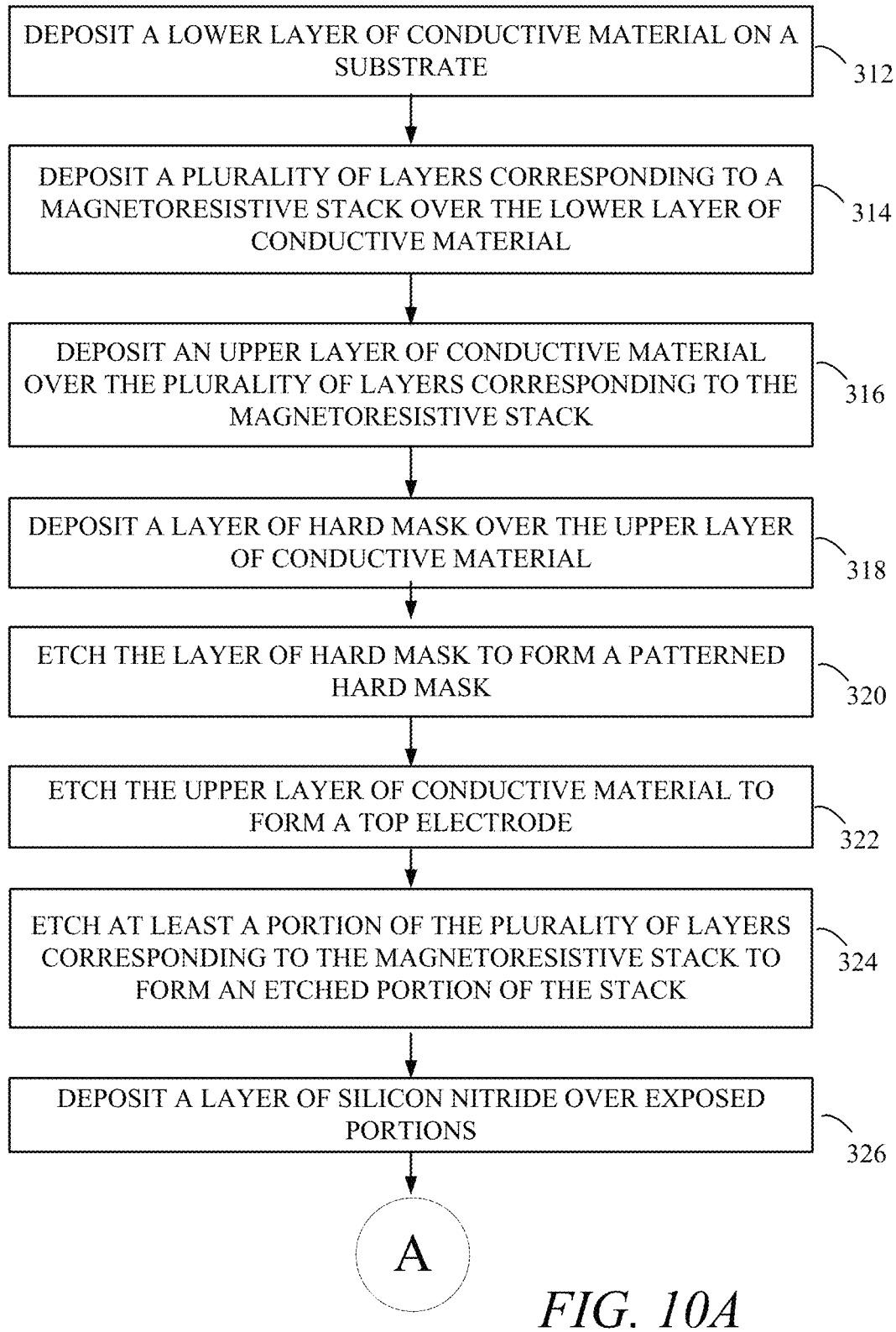
FIGS. 10A and 10B are a flow chart of a method of manufacturing a magnetoresistive device in accordance with an exemplary embodiment.
Figure 10B:
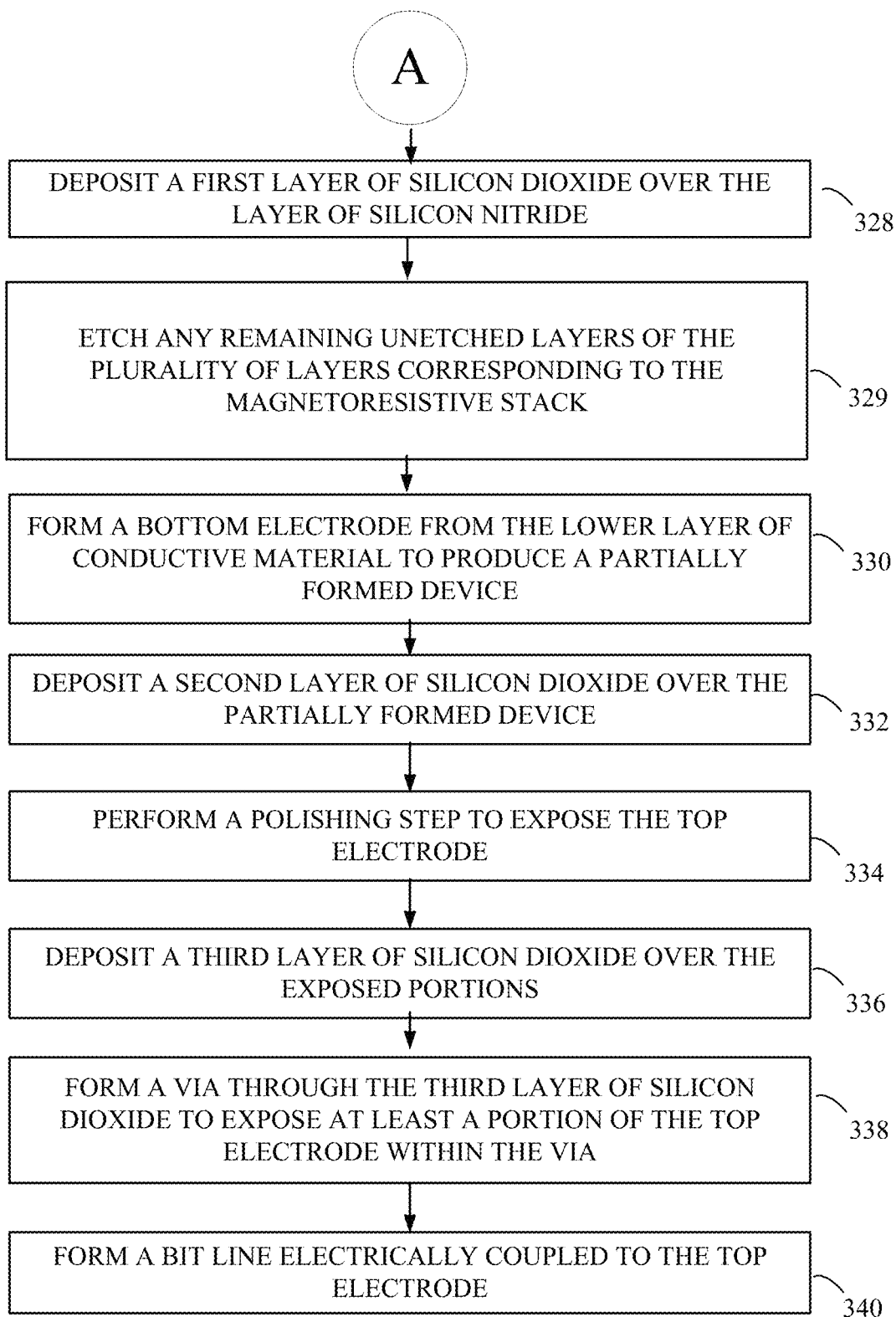
Figure 11:
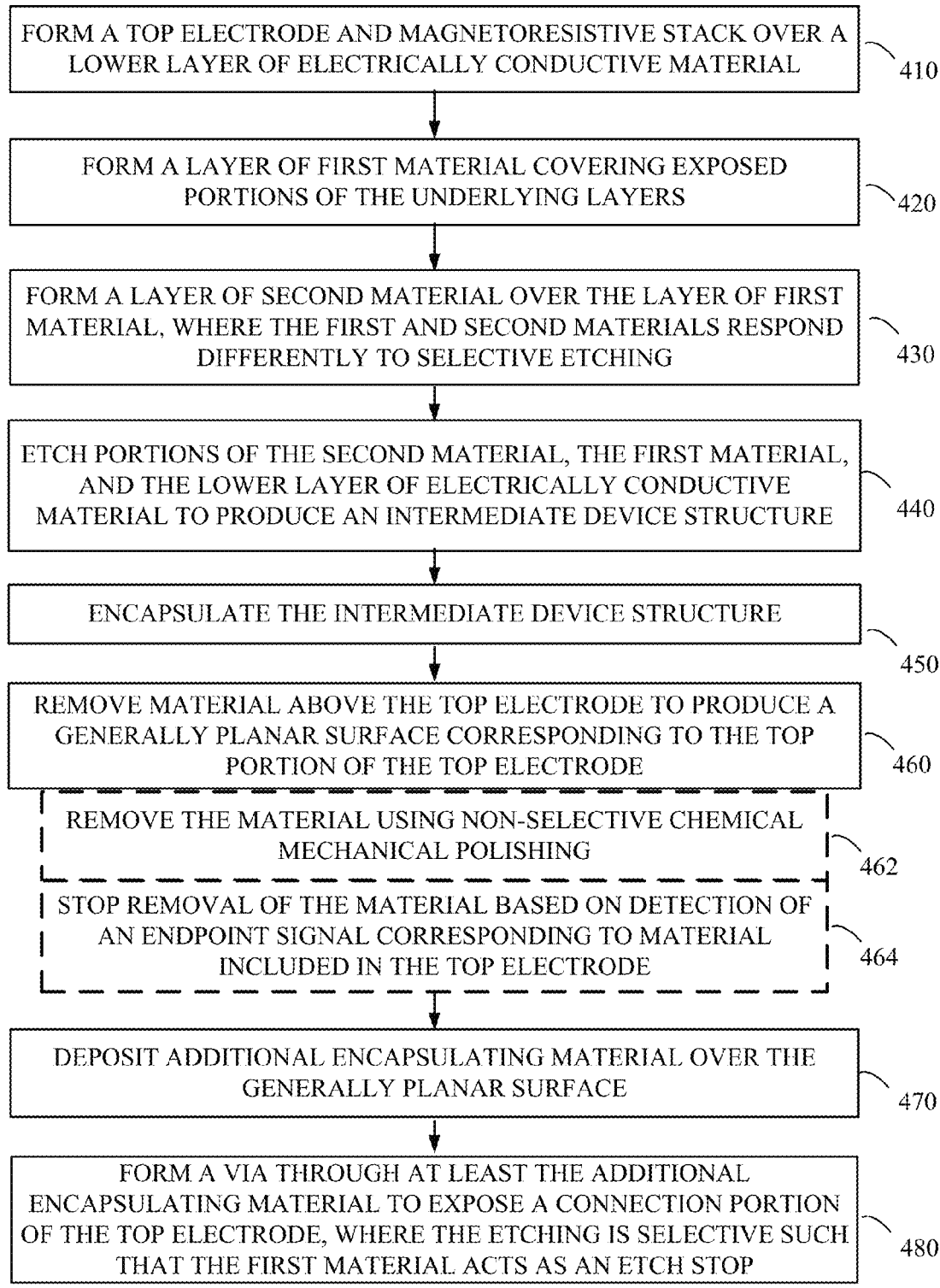
FIG. 11 is a flow chart of a method of manufacturing a magnetoresistive device in accordance with another exemplary embodiment.

FIGS. 10-11 are flow charts that illustrate exemplary embodiments of a method of manufacturing a magnetoresistive device, where, in one example, the magnetoresistive device is a spin-torque MTJ device included in an MRAM. The operations included in the flow charts may represent only a portion of the overall process used to manufacture the device. The various tasks performed in connection with the methods of FIGS. 10-11 may be performed by software, hardware, firmware, or any combination thereof. For illustrative purposes, the following description of the methods in FIGS. 10-11 may refer to elements mentioned above in connection with FIGS. 1-9. In practice, portions of methods may be performed by different elements of the described system, e.g., a processor, a display element, or a data communication component. It should be appreciated that methods may include any number of additional or alternative tasks, the tasks shown in FIGS. 10-11 need not be performed in the illustrated order, and the methods may be incorporated into a more comprehensive procedure or process having additional functionality not described in detail herein. Moreover, one or more of the tasks shown in FIGS. 10-11 could be omitted from an embodiment as long as the intended overall functionality remains intact.

FIG. 10, which includes FIGS. 10A and 10B, illustrates a flow chart of a portion of the magnetoresistive device manufacturing process. At 312, a lower layer of conductive material is deposited on a substrate. The lower layer of conductive material is used to form the bottom electrode for the magnetoresistive device. In order to provide electrical access to the magnetoresistive device, the lower layer of conductive material may be formed over one or more vias or other conductive elements.

At 314, a plurality of layers corresponding to a magnetoresistive stack are deposited over the lower layer of conductive material. The layers may be deposited directly on the lower layer of conductive material, or there may be one or more intermediate layers between the plurality of layers and the underlying lower layer of conductive material. As noted above, the plurality of layers included in the magnetoresistive stack includes a number of different layers, some of which are magnetic and others of which are not. One of ordinary skill in the art appreciates that different configurations of magnetoresistive stacks are known, and the teachings provided herein are applicable regardless as to the specific layers included in the magnetoresistive stack.

At 316, an upper layer of conductive material is deposited over the plurality layer of layers corresponding to the magnetoresistive stack. At 318, a layer of hard mask is deposited over the upper layer of conductive material. The layer of hard mask is used to control subsequent etching operations. Typically, a layer of photoresist would be formed over the layer of hard mask and patterned. Following patterning of the photoresist, the remaining portions of the photoresist would be used to shield the underlying hard mask from removal, thereby transferring the pattern to the layer of hard mask. Thus, at step 320, the layer of hard mask is etched to form a patterned hard mask. Any remaining hard mask thereby controls what aspects of the underlying layers (e.g. upper layer of conductive material, some or all of the layers in the magnetoresistive stack, etc.) are removed during subsequent etching steps. In some embodiments, the hard mask material is silicon dioxide.

At 322, the upper layer of conductive material is etched to form a top electrode. Thus, using the patterned hard mask as a means to control where the etching occurs, the portions of the upper layer of conductive material not corresponding to the top electrode can be removed. At 324, at least a portion of the plurality of layers corresponding to the magnetoresistive stack are etched to form an etched portion of the magnetoresistive stack. Depending on the makeup of the various layers included in the magnetoresistive stack, the etching may be a single step, or multiple steps interspersed with encapsulation or other processing steps aimed at ensuring proper operation of the magnetoresistive device. The portion of the plurality of layers etched at 324 may include all of the layers corresponding to the magnetoresistive stack, or, in other embodiments, may only include an upper portion of the layers corresponding to the stack. For example, all of the layers above a tunnel barrier may be etched, where the layers above the tunnel barrier correspond to either the fixed layer or the free layer of the magnetoresistive device. The etching at 324 may also include etching the dielectric layer corresponding to the tunnel barrier for the device.

At 326, a layer of silicon nitride is deposited over exposed portions of the patterned hard mask, the top electrode, the etched portion of the magnetoresistive stack, any remaining unetched portion of the plurality of layers corresponding to the magnetoresistive stack, and the lower layer of conductive material. Thus, as was shown with respect to FIG. 2 above, the silicon nitride covers the top surface of the lower layer of electrically conductive material (or unetched lower layers of the magnetoresistive stack if the stack is not fully defined at 324) as well as the exposed sidewalls of the magnetoresistive stack and the top electrode. At 328, a first layer of silicon dioxide is deposited over the layer of silicon nitride. The first layer of silicon dioxide may be used to establish the masking necessary to perform subsequent etching operations, including definition of the bottom electrode.

At 329, any remaining unetched layers of the plurality of layers corresponding to the magnetoresistive stack are etched to complete the patterned magnetoresistive stack. At 330, the bottom electrode is formed from the lower layer of conductive material. Etching any remaining unetched layers in the stack and forming the bottom electrode includes removal of portions of the layer of silicon nitride and portions of the layer of silicon dioxide that are not over the portion of the unetched stack layers and the lower layer of conductive material that remain as the rest of the stack and the bottom electrode. The etching that results in complete stack patterning and formation of the bottom electrode removes material between devices in embodiments where many devices are included in an array on the substrate. Completion of the stack and formation of the bottom electrode results in a partially formed device that is ready for encapsulation and formation of a connection to the top electrode.

At 332, a second layer of silicon dioxide is deposited over the partially formed device and portions of the substrate that are not covered by the partially formed device. Thus, the device, as formed up to this point in the process, is encapsulated in silicon dioxide. Silicon dioxide is an insulator, thereby isolating neighboring devices from each other. At 334, a polishing step is performed to expose the top electrode. The polishing includes removing portions of the first and second layers of silicon dioxide, portions of the layer of silicon nitride (e.g. on the top surface and sidewalls of the patterned hard mask), and the patterned hard mask. The polishing step performed at 334 may include a chemical mechanical polish that is nonselective with respect to silicon dioxide and silicon nitride such that it removes those materials at about the same rate. The chemical mechanical polishing performed may result in a generally flat surface corresponding generally to an exposed top surface of the top electrode. One example of such a generally flat surface is depicted in FIG. 5, which was discussed above. In other embodiments, the chemical mechanical polishing, while being nonselective with respect to silicon dioxide and silicon nitride, may be selective with respect to the material included in the top electrode. In such an embodiment, a top portion of the top electrode may extend above a generally flat surface resulting from removing the silicon dioxide and silicon nitride.

The polishing performed at step 334 may include detecting an endpoint signal corresponding to material included in the top electrode and stopping the polishing based on the detection of the endpoint signal. For example, a determination as to when to stop the polishing may be based on detection of the presence of tantalum or tantalum nitride in an optical omission spectrum, thereby indicating that the polishing has reached a depth corresponding to the upper surface of the top electrode. In other embodiments, the polishing may be stopped after a certain amount of time or after measurements indicate that the desired amount of material has been removed, thereby ensuring exposure of the top electrode without over-polishing that might be detrimental to device operation.

Because at least the top surface of the top electrode is exposed by the polishing performed at step 334, a bit line may be directly connected to the exposed portion of the top electrode. As noted above, this can be facilitated by selectively removing the silicon dioxide and silicon nitride in a manner that causes a portion of the top electrode to extend above the generally planar surface resulting from the polishing performed at 334.

In other embodiments where the bit line is not directly connected to the top electrode, a via is formed within inter-layer insulating material to enable connection to the top electrode. At 336, a third layer of silicon dioxide is deposited over the exposed portions of the device. An example of such a re-deposition step corresponds to the cross-sectional view illustrated in FIG. 6 above. The third layer of silicon dioxide is deposited over the top electrode as exposed, exposed portions of the first and second layers of silicon dioxide, and exposed portions of the layer of silicon nitride.

At 338, a via is formed, which includes etching through the third layer of silicon dioxide to expose at least a portion of the top electrode within the hole corresponding to the via. Etching for the via may also extend through a portion of the second layer of silicon dioxide, but the etching process is preferably selective with respect to silicon nitride such that the silicon nitride acts as an etch stop. The via formed at 338 may be filled with electrically conductive material such as copper. At 340, a bit line is formed, where the bit line is electrically coupled to the top electrode by the via.

By using nonselective polishing to remove any silicon nitride overlying the top electrode, but selective etching to form the via, the formation of two distinct layers of insulating material can be leveraged to avoid problems previously experienced as a result of over-etching. By providing the silicon nitride to act as an etch stop, etching corresponding to via formation cannot reach the bottom electrode or the lower layers within the magnetoresistive stack, thereby avoiding potential electrical shorts between those device portions and the top electrode.

FIG. 11 illustrates a flow chart of a portion of the magnetoresistive device manufacturing process. At 410 a top electrode and magnetoresistive stack are formed over a lower layer of electrically conductive material such that the magnetoresistive stack is between the top electrode and the lower layer of electrically conductive material. As noted above, the particular layers included in the magnetoresistive stack and their ordering within that stack is not the focus of the embodiments disclosed herein. As also noted above, in other embodiments, only a portion of the layers corresponding to the magnetoresistive stack may initially be formed, whereas the remaining layers are etched or otherwise patterned later, such as during operations that include formation of the bottom electrode.

At 420 a layer of a first material is formed to cover the exposed portions of the top electrode, exposed portions of the magnetoresistive stack, and exposed portions of the lower layer of conductive material. An example of such formation corresponds to the formation of layer 150 illustrated in FIG. 2. At 430, a layer of a second material is formed over the layer of the first material, where the first and second materials respond differently to selective etching. An example of the layer of second material is layer 160 in FIG. 2. In the example embodiments discussed above, the layer of first material corresponds to a layer of silicon nitride, whereas the layer of second material corresponds to a layer of silicon dioxide. While those specific materials are presented as examples, other materials that provide the necessary functionality of those layers may be appropriate in other embodiments. For example, dielectric materials commonly used as an etch stop can be used in the layer of first material, while dielectric materials commonly used to contain the bulk of metal lines in a damascene process can be used in the layer of second material. Thus, other insulating materials can be used where the first and second materials are removed at approximately the same rate in some removal operations, whereas in other removal operations, the second material can be selectively removed while leaving the first material behind. Such functionality allows the first material to serve as a barrier protecting the underlying bottom electrode and sidewalls of the magnetoresistive stack.

At 440, portions of each of the layer of second material, the layer of first material, and the lower layer of electrically conductive material are etched to define the bottom electrode and produce an intermediate device structure. In embodiments where only a portion of the stack is defined prior to deposition of the layer of the first material, the removal at 440 includes removing portions of the remaining stack layers to fully define the stack. The intermediate device structure is separated from other device structures that may be included in an array of devices, such as in a magnetic random access memory. At 450, the intermediate device structure is encapsulated in encapsulation material. The encapsulation material is preferably an insulator that isolates the intermediate device structure from neighboring devices. The encapsulation material may correspond to the material used to form the layer of second material, which, in some embodiments, is silicon dioxide.

At 460, material above a top portion of the top electrode is removed to produce a generally planar surface corresponding to the top portion of the top electrode such that the top portion of the top electrode is exposed. The material removed includes portions of the encapsulating material, portions of the layer of second material, and portions of the layer of the first material. In some embodiments, the encapsulation material, the first material, and the second material are removed at approximately the same rate using non-selective chemical mechanical polishing at 462. The removal of material at 460 may also be stopped at 464 based on detection of an endpoint signal corresponding to material included in the top electrode. Thus, using optical emission spectroscopy or some other detection technique, the point at which the removal of material reaches the surface of the top electrode can be determined, thereby indicating such removal should be stopped. In other embodiments, a determination as to when to stop removing material may be based on an amount of time or physical measurements taken of the structure to determine how much material has been removed or remains.

At 470, additional encapsulating material is deposited over the generally planar surface. Such additional encapsulating material may help avoid inadvertent connections to any veils resulting from formation of the bottom electrode. The additional encapsulating material provides for an interlayer insulating barrier through which a via is formed at 480. The via is formed by first making a hole in the additional encapsulating material to expose a connection portion of the top electrode, and the hole is filled with electrically conductive material that physically contacts the top electrode. Note that while the electrically conductive material of the via may also physically contact the first material, because the first material is insulating, undesirable shorts to the lower portion of the magnetoresistive device do not result. The etch used to form the via is selective such that the first material acts as an etch stop, thereby protecting the lower portion of the magnetoresistive stack and the bottom electrode from potential short circuits with the via.

Although the described exemplary embodiments disclosed herein are directed to various magnetoresistive-based devices and methods for making same, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing a magnetoresistive device, comprising:
   depositing a lower layer of conductive material on a substrate;
   depositing a plurality of layers corresponding to a magnetoresistive stack over the lower layer of conductive material;
   depositing an upper layer of conductive material over the plurality of layers corresponding to the magnetoresistive stack;
   depositing a layer of hard mask over the upper layer of conductive material;
   etching the layer of hard mask to form a patterned hard mask;
   etching the upper layer of conductive material to form a top electrode;

etching the plurality of layers corresponding to the magnetoresistive stack to form the magnetoresistive stack;

depositing a layer of silicon nitride over exposed portions of the patterned hard mask, the top electrode, the magnetoresistive stack, and the lower layer of conductive material;

depositing a first layer of silicon dioxide over the layer of silicon nitride;

forming a patterned layer of photoresist over the first layer of silicon dioxide;

forming a bottom electrode from the lower layer of conductive material, wherein forming the bottom electrode includes removal of portions of the layer of silicon nitride, portions of the first layer of silicon dioxide, and portions of the lower layer of conductive material that are not covered by the layer patterned layer of photoresist, wherein forming the bottom electrode results in a partially formed device having remaining portions of the first layer of silicon dioxide and the layer of silicon nitride over a remaining portion of the lower layer of conductive material, wherein the remaining portion of the lower layer of conductive material corresponds to the bottom electrode;

depositing a second layer of silicon dioxide over the partially formed device and portions of the substrate not covered by the partially formed device;

performing a polishing step to expose the top electrode, wherein the polishing includes removing (i) portions of the first and second layers of silicon dioxide, (ii) portions of the layer of silicon nitride on a top surface and sidewalls of the patterned hard mask, and (iii) the patterned hard mask;

depositing a third layer of silicon dioxide over (i) the top electrode as exposed, (ii) exposed portions of the first and second layers of silicon dioxide, and (iii) exposed portions of the layer of silicon nitride; and forming a via through the third layer of silicon dioxide to expose at least a top portion of the top electrode within the via, wherein forming the via further comprises etching the first layer of silicon dioxide and the second layer of silicon dioxide below the top portion of the top electrode using an etching chemistry selective with respect to silicon nitride such that portions of the layer of silicon nitride remaining after the polishing step act as an etch stop such that the portions of the layer of silicon nitride remaining after the polishing step are not removed and act as a barrier to further etching during the formation of the via.

2. The method of claim 1, further comprises forming a bit line coupled to the via.

3. The method of claim 1, wherein performing the polishing step further comprises performing a chemical mechanical polish that removes silicon dioxide and silicon nitride at about the same rate.

4. The method of claim 3, wherein performing the polishing step results in a generally flat surface corresponding generally to an exposed top surface of the top electrode.

5. The method of claim 4, wherein performing the polishing step further comprises:
detecting an endpoint signal corresponding to material included in the top electrode; and
stopping the polishing based on the endpoint signal.

6. The method of claim 1 further comprises: forming an underlying via in the substrate prior to depositing the lower layer of conductive material, wherein the underlying via is offset from a center of the magnetoresistive stack after formation of the magnetoresistive stack.

7. The method of claim 1, wherein forming the via further comprises forming the via such that the via is offset from a center of the magnetoresistive stack.

8. The method of claim 1, wherein forming the via further comprises forming the via to have a size greater than a corresponding size of the magnetoresistive stack.

9. The method of claim 1, wherein the portions of the layer of silicon nitride remaining after the polishing step protect the magnetoresistive stack and the bottom electrode from a short circuit with the via.

10. A method of manufacturing a magnetoresistive device that includes a top electrode, a magnetoresistive stack, and a bottom electrode, the method comprising:

forming the top electrode and the magnetoresistive stack over a lower layer of electrically conductive material such that the magnetoresistive stack is between the top electrode and the lower layer of electrically conductive material;

forming a layer of a first material covering exposed portions of (i) the top electrode, (ii) the magnetoresistive stack, and (iii) the lower layer of conductive material;

forming a layer of a second material over the layer of the first material, wherein the first and second materials respond differently to selective etching;

forming a patterned layer of photoresist over the layer of the second material;

etching portions of each of the layer of the second material, the layer of the first material, and the lower layer of electrically conductive material not covered by the patterned layer of photoresist to define the bottom electrode and produce an intermediate device structure having remaining portions of the layer of the first material and the layer of the second material over a remaining portion of the lower layer of electrically conductive material, wherein the remaining portion of the lower layer of electrically conductive material corresponds to the bottom electrode;

encapsulating the intermediate device structure in encapsulation material;

removing material above a top portion of the top electrode to produce a generally planar surface corresponding to the top portion of the top electrode such that the top portion of the top electrode is exposed, wherein the material removed includes portions of (i) the encapsulating material, (ii) the layer of the second material, and (iii) the layer of the first material;

depositing additional encapsulating material over the generally planar surface; and forming a via through at least the additional encapsulating material, wherein forming a via includes etching to expose the top portion of the top electrode, wherein the etching etches the layer of the second material and the encapsulation material below the top portion of the top electrode and uses a selective etch with respect to the first material such that portions of the first material remaining after the removal of material above the top portion of the top electrode to produce the generally planar surface act as an etch stop such that the portions of the first material remaining after the removal of material above the top portion of the top electrode are not removed during the formation of the via and act as a barrier to further etching during the formation of the via.

11. The method of claim 10, wherein removing material above the top portion of the top electrode includes chemical mechanical polishing without selectivity for the first material and the second material.

12. The method of claim 10, wherein the first material is silicon nitride and the second material is silicon dioxide.

13. The method of claim 10, wherein forming the via further comprises forming the via such that the via is offset from a center of the magnetoresistive stack.

14. The method of claim 10, wherein forming the via further comprises forming the via to have a size greater than a corresponding size of the magnetoresistive stack.

15. The method of claim 10, wherein the portions of the layer of the first material remaining after the removal of material above the top portion of the top electrode to produce the generally planar surface protect the magnetoresistive stack and the bottom electrode from a short circuit with the via.

* * * * *